(12) United States Patent
Zhang et al.

(10) Patent No.: US 10,347,578 B2
(45) Date of Patent: Jul. 9, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Cheng Long Zhang, Shanghai (CN); Qi Yang He, Shanghai (CN); Yan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/673,628

(22) Filed: Aug. 10, 2017

(65) Prior Publication Data

US 2018/0047665 A1    Feb. 15, 2018

(30) Foreign Application Priority Data

Aug. 12, 2016   (CN) .......................... 2016 1 0664696

(51) Int. Cl.
*H01L 21/00* (2006.01)
*H01L 23/528* (2006.01)
(Continued)

(52) U.S. Cl.
CPC ........ *H01L 23/528* (2013.01); *H01L 21/0276* (2013.01); *H01L 21/31116* (2013.01);
(Continued)

(58) Field of Classification Search
CPC ............ H01L 23/528; H01L 21/76843; H01L 21/76811
See application file for complete search history.

(56) References Cited

U.S. PATENT DOCUMENTS

| 7,071,099 B1* | 7/2006 | Greco ............... H01L 21/76807 |
| | | 257/752 |
| 2006/0186548 A1* | 8/2006 | Enomoto .......... H01L 21/76808 |
| | | 257/758 |

(Continued)

FOREIGN PATENT DOCUMENTS

DE    102005030588 A1    1/2007

OTHER PUBLICATIONS

The European Patent Office (EPO) The Extended European Search Report for 17185664.4 dated Jan. 29, 2018 10 Pages.

*Primary Examiner* — Laura M Menz
(74) *Attorney, Agent, or Firm* — Anova Law Group, PLLC

(57) ABSTRACT

A semiconductor structure and a method for fabricating the semiconductor structure are provided. The method includes providing a base substrate including a device region and a peripheral region. The base substrate includes a base interconnection structure. The method also includes forming a medium layer on the base substrate. In addition, the method includes forming a first trench having a first depth in the peripheral region, and forming a second trench having a second depth in the device region. The second depth is greater than the first depth. Moreover, the method includes forming a first opening in the device region and forming a second opening in the peripheral region. Further, the method includes forming a first interconnection structure by filling the first opening with a conductive material and forming a (Continued)

second interconnection structure by filling the second opening with the conductive material.

17 Claims, 8 Drawing Sheets

(51) Int. Cl.
    *H01L 21/027*    (2006.01)
    *H01L 21/311*    (2006.01)
    *H01L 21/768*    (2006.01)
    *H01L 23/522*    (2006.01)

(52) U.S. Cl.
    CPC .. *H01L 21/31144* (2013.01); *H01L 21/76811* (2013.01); *H01L 21/76813* (2013.01); *H01L 21/76816* (2013.01); *H01L 21/76843* (2013.01); *H01L 21/76865* (2013.01); *H01L 21/76871* (2013.01); *H01L 21/76877* (2013.01); *H01L 23/5226* (2013.01)

(56) References Cited

U.S. PATENT DOCUMENTS

2011/0104867 A1*  5/2011  Feustel ............. H01L 21/76808
                                                                438/424
2013/0337650 A1* 12/2013  Lee ...................... H01L 21/302
                                                                438/702
2018/0047665 A1*  2/2018  Zhang ................ H01L 21/0276

* cited by examiner

US 10,347,578 B2

SEMICONDUCTOR STRUCTURE AND FABRICATION METHOD THEREOF

CROSS-REFERENCES TO RELATED APPLICATIONS

This application claims the priority of Chinese patent application No. 201610664696.7, filed on Aug. 12, 2016, the entirety of which is incorporated herein by reference.

FIELD OF THE INVENTION

The present invention generally relates to the field of semiconductor manufacturing technology and, more particularly, relates to a semiconductor structure and fabrication method thereof.

BACKGROUND

Semiconductor device usually includes multiple metal layers to provide sufficient interconnection. The interconnection between the multiple metal layers and the connection between active region of the semiconductor device and external circuit can be achieved by filling through holes with conductive materials.

With the development of ultra-large-scale integration, the number of layers of the metal layers in the semiconductor device increases. As feature dimensions of ICs reduce, the size of the through hole gradually decreases. The smaller the size of the through hole, the more difficult to form the through hole. The formation quality of the through hole greatly affects the performance of the back end of line (BEOL) circuit, and could even affect the normal operation of the semiconductor device.

However, conventionally formed through hole may easily cause degradation of the electrical performance of the semiconductor device. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a base substrate including a device region and a peripheral region surrounding the device region. The base substrate includes a base interconnection structure formed in each of the device region and the peripheral region. The method also includes forming a medium layer on the base substrate. In addition, the method includes forming a first trench having a first depth in the medium layer in the peripheral region, and forming a second trench having a second depth in the medium layer in the device region. The second depth is greater than the first depth. Moreover, the method includes forming a first opening exposing the base interconnection structure in the medium layer in the device region and forming a second opening exposing the base interconnection structure in the medium layer in the peripheral region by etching the medium layer at a bottom and a sidewall of the second trench and etching the medium layer at a bottom of the first trench. Further, the method includes forming a first interconnection structure by filling the first opening with a conductive material and forming a second interconnection structure by filling the second opening with the conductive material.

Another aspect of the present disclosure includes a semiconductor structure. The semiconductor structure includes a base substrate including a device region and a peripheral region surrounding the device region. The base substrate includes a base interconnection structure formed in each of the device region and the peripheral region. The semiconductor structure also includes a medium layer on the base substrate. In addition, the semiconductor structure includes a first interconnection structure through the medium layer and on the base interconnection structure in the device region. Further, the semiconductor structure includes a second interconnection structure through the medium layer and on the base interconnection structure in the peripheral region. The first interconnection structure includes a first portion on the base interconnection structure, and a second portion partially on the first portion and partially on a portion of the medium layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

FIGS. 1-5 illustrate semiconductor structures corresponding to certain stages for forming a semiconductor structure. The fabrication method of the semiconductor structure includes the following.

Figure 1:
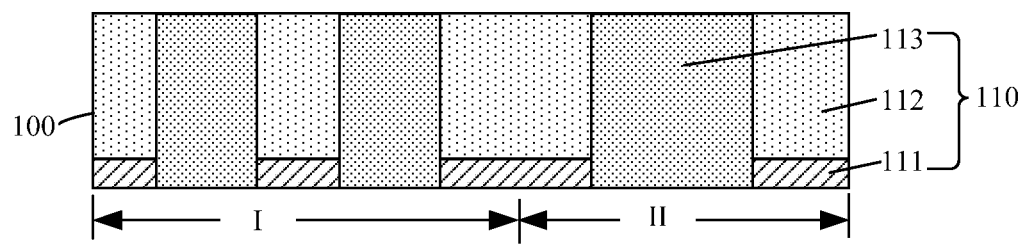
FIGS. 1-5 illustrate semiconductor structures corresponding to certain stages for forming a semiconductor structure.

Referring to FIG. 1, a base substrate 100 is provided. The base substrate 100 includes a device region I and a peripheral region II surrounding the device region I. A base interconnection structure 110 is formed in both the base substrate 100 in the device region I and the base substrate 100 in the peripheral region II. The base interconnection structure 110 includes a base etching barrier layer 111, a base dielectric layer 112 formed on the base etching barrier layer 111, and a base metal layer 113 formed in the base dielectric layer 112.

Figure 2:
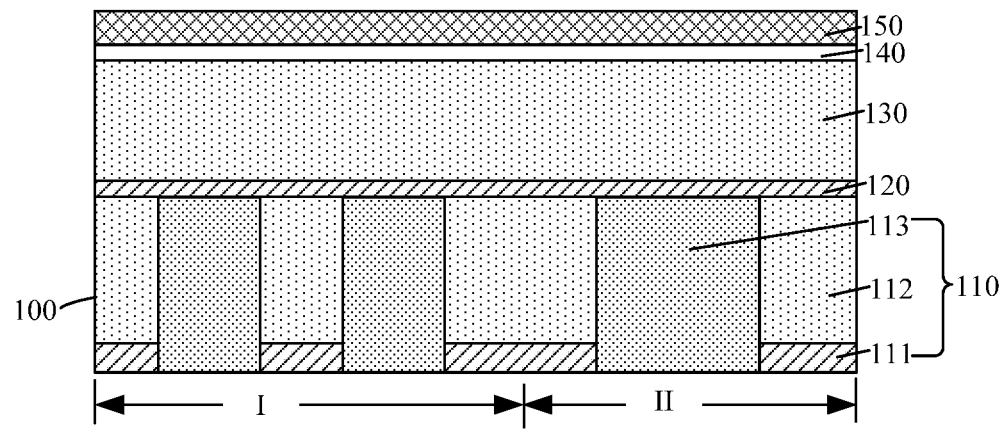

Referring to FIG. 2, a medium layer (not labeled) is formed on the base substrate 100. The medium layer includes an etching barrier layer 120, a dielectric layer 130, an oxide layer 140 and a metal hard mask layer 150 sequentially formed on the base substrate 100.

Figure 3:
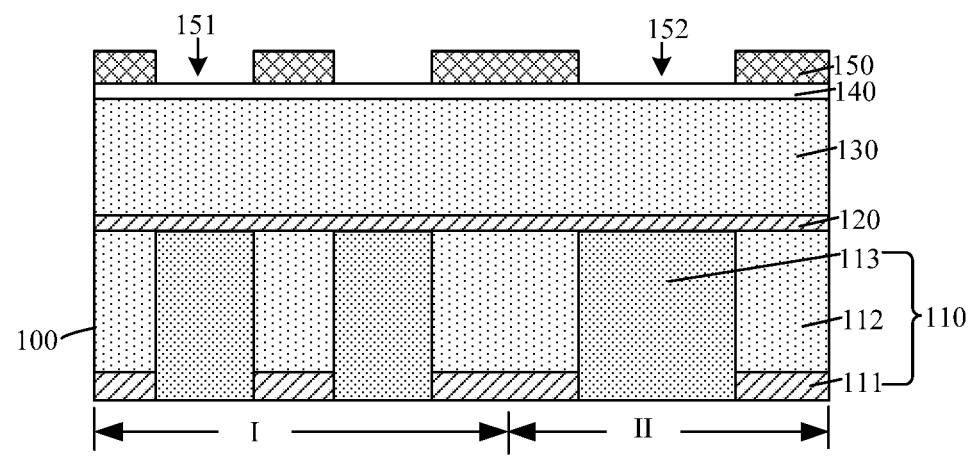

Referring to FIG. 3, the metal hard mask layer 150 is patterned to form a first pattern opening 151 penetrating through the metal hard mask layer 150 in the metal hard mask layer 150 in the device region I, and to form a second pattern opening 152 penetrating through the metal hard mask layer 150 in the metal hard mask layer 150 in the peripheral region II. The position and opening size of the first pattern opening 151 are the same as the position and opening size of a trench subsequently formed in the medium layer in the device region I. The position and opening size of the second pattern opening 152 are the same as the position and opening size of a second opening subsequently formed in the medium layer in the peripheral region II.

Figure 4:
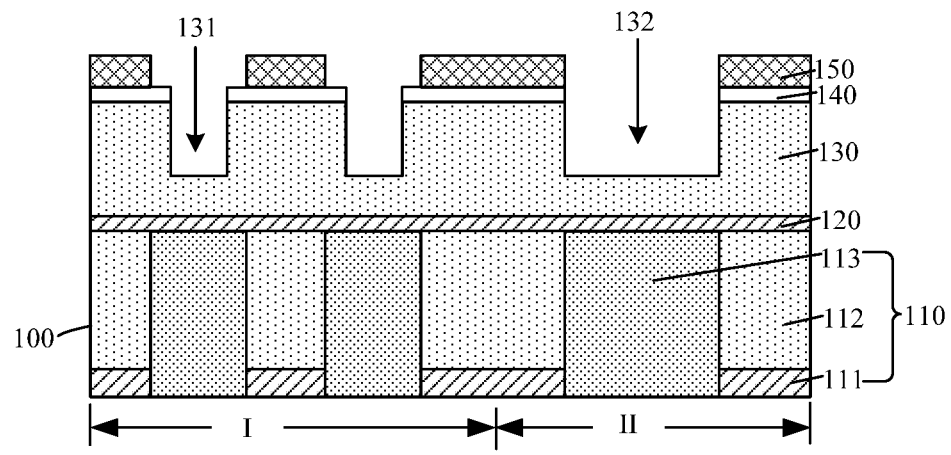

Referring to FIG. 4, a patterned layer (not labeled) is formed on portions of surface of the oxide layer 140. The patterned layer also covers the surface of the patterned metal hard mask layer 150. The patterned layer may include a third pattern opening (not labeled) in the device region I and a fourth pattern opening (not labeled) in the peripheral region II. The projection of the third pattern opening on the base substrate 100 is located within the projection of the first pattern opening 151 on the base substrate 100. The projection of the fourth pattern opening on the base substrate 100 is located within the projection of the second pattern opening 152 on the base substrate 100. The oxide layer 140 and portions of thickness of the dielectric layer 130 may be sequentially etched through the third pattern opening and the fourth pattern opening with the patterned layer as an etching mask to form a first trench 131 in the medium layer in the device region I, and to form a second trench 132 in the medium layer in the peripheral region II. The first trench 131 and the second trench 132 are formed in the same etching process. The patterned layer is then removed.

Figure 5:
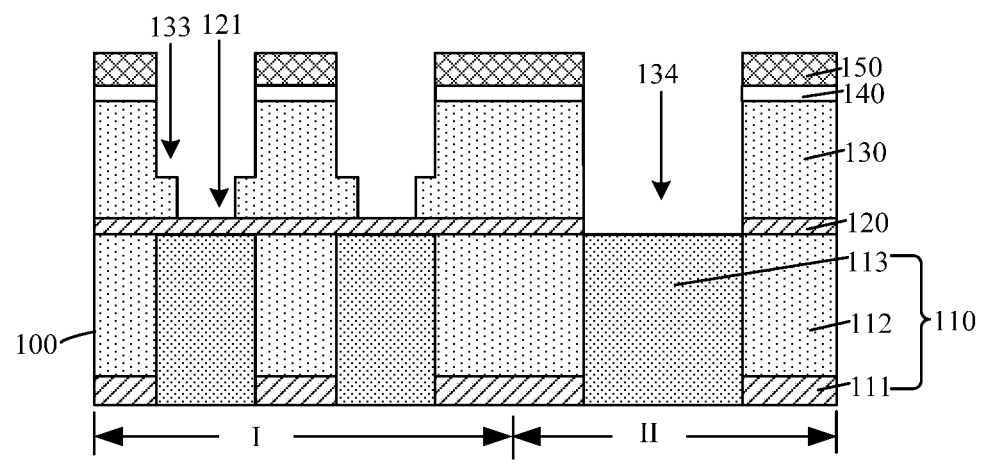

Referring to FIG. 5, the oxide layer 140 and the dielectric layer 130 at the bottom and sidewall of the first trench 131 (shown in FIG. 4) may be etched through the first pattern opening 151 (shown in FIG. 3) with the patterned metal hard mask layer 150 as an etching mask until the etching barrier layer 120 is exposed, to form a trench 133 and a first initial through hole 121 penetrating through each other in the medium layer in the device region I. The dielectric layer 130 at the bottom of the second trench 132 (shown in FIG. 4) is etched through the second pattern opening 152 until the etching barrier layer 120 is exposed, to from an initial opening 134 in the medium layer in the peripheral region II.

The subsequent fabrication method also includes etching the etching barrier layer 120 at the bottom of the first initial through hole 121 to form a through hole exposing the base interconnection structure 110 in the device region I. The trench 133 and the through hole form the first opening. The bottom of the trench 133 is connecting to the top of the through hole, and the opening size of the bottom of the trench 133 is larger than the opening size of the top of the through hole. Further, the fabrication method includes etching the etching barrier layer 120 at the bottom of the initial opening 134 to form a second opening exposing the base interconnection structure 110 in the peripheral region II.

However, the pattern intensity of the device region I is larger than the pattern intensity of the peripheral region II. The larger the pattern intensity is, the smaller the etching rate is under the same etching conditions. Thus, the etching rate of the dielectric layer 130 in the device region I is smaller than the etching rate of the dielectric layer 130 in the peripheral region II. When forming the first initial through hole 121 and the initial opening 134, the etching barrier layer 120 is first exposed by the initial opening 134. Therefore, when forming the first initial through hole 121 by continuously etching the dielectric layer 130 through the first pattern opening 151, the etching barrier layer 120 exposed by the initial opening 134, and even the base interconnection structure 110 can be etched. As a result, the base interconnection structure 110 in the peripheral region II may be damaged, thereby resulting in the degradation of the electrical performance of the semiconductor device.

Figure 15:
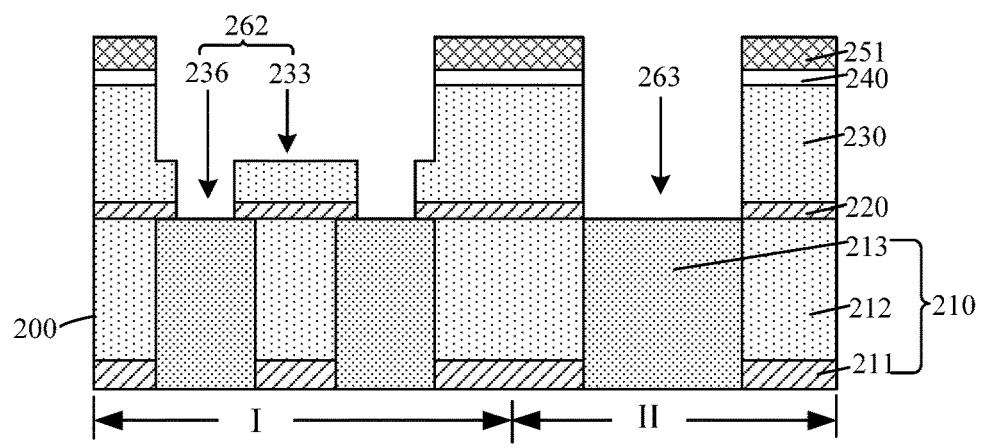
Figure 16:
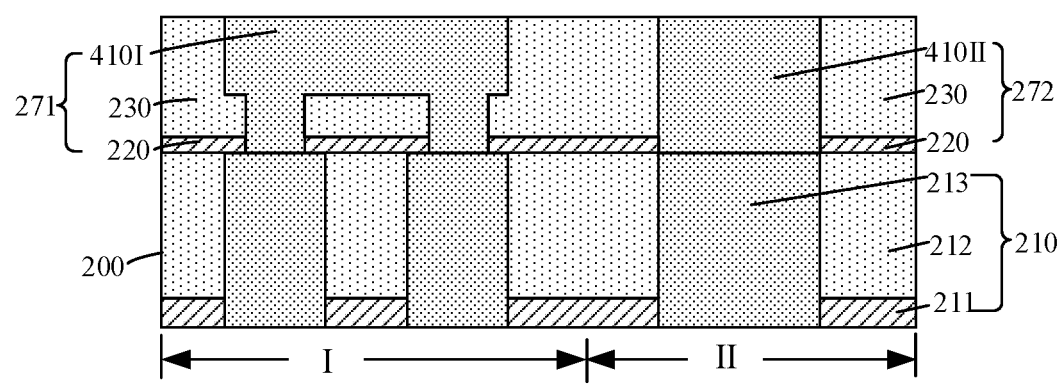
Figure 17:
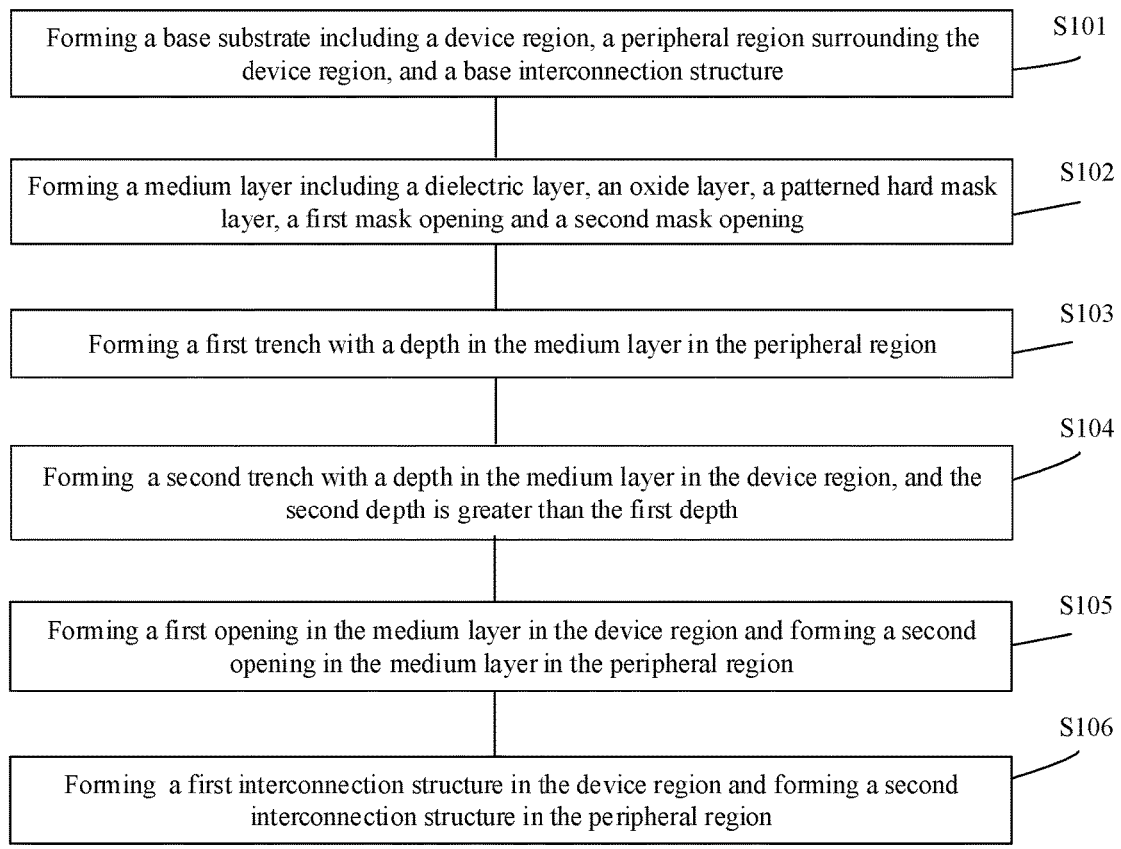
FIG. 17 illustrates an exemplary fabrication method to form a semiconductor structure consistent with various disclosed embodiments of the present disclosure.

The present disclosure provides a semiconductor structure and fabrication process thereof. FIG. 17 illustrates an exemplary fabrication method to form a semiconductor structure consistent with the disclosed embodiments; and FIGS. 6-16 illustrate semiconductor structures corresponding to certain stages of the exemplary fabrication method.

Figure 6:
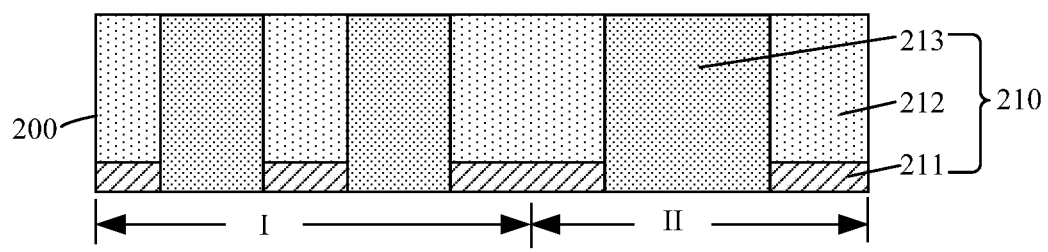
FIGS. 6-16 illustrate semiconductor structures corresponding to certain stages of an exemplary fabrication method to form a semiconductor structure consistent with various disclosed embodiments of the present disclosure.

As shown in FIG. 17, at the beginning of the fabrication method, a base substrate with certain structures may be provided (S101). FIG. 6 illustrates a corresponding semiconductor structure.

Referring to FIG. 6, a base substrate 200 may be provided. The base substrate 200 may include a device region I and a peripheral region II surrounding the device region I. A base interconnection structure 210 may be formed in both the base substrate 200 in the device region I and the base substrate 200 in the peripheral region II.

The base substrate may provide a platform for subsequent fabrication processes to form the semiconductor structure. The base interconnection structure 210 may be configured to connect to the interconnection structure to be formed, and also be configured to connect to external devices or other metal layers. In one embodiment, the base interconnection structure 210 may include a base etching barrier layer 211 formed in the base substrate 200, a base dielectric layer 212 formed on the base etching barrier layer 211, and a base metal layer 213 formed in the base dielectric layer 212. The top of the base metal layer 213 may be coplanar with the top of the base dielectric layer 212.

One base metal layer 213 may be formed in each of the base substrate 200 in the device region I and the base substrate 200 in the peripheral region II. Or a plurality of the base metal layers 213 may be formed in each of the base substrate 200 in the device region I and the base substrate 200 in the peripheral region II. When the plurality of base metal layers 213 are formed in each of the base substrate 200 in the device region I and the base substrate 200 in the peripheral region II, the size of the plurality of base metal layers 213 in a direction parallel to the surface of the base substrate 200 may be the same or different. In one embodiment, the base metal layer 213 may be made of Cu. In certain embodiments, the base metal layer 213 may be made of Al, W, or other conductive materials.

Figure 7:
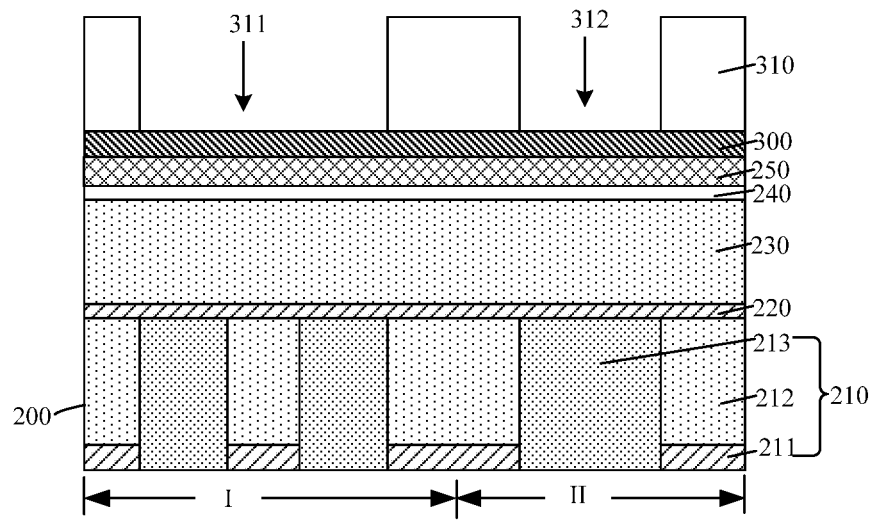
Figure 8:
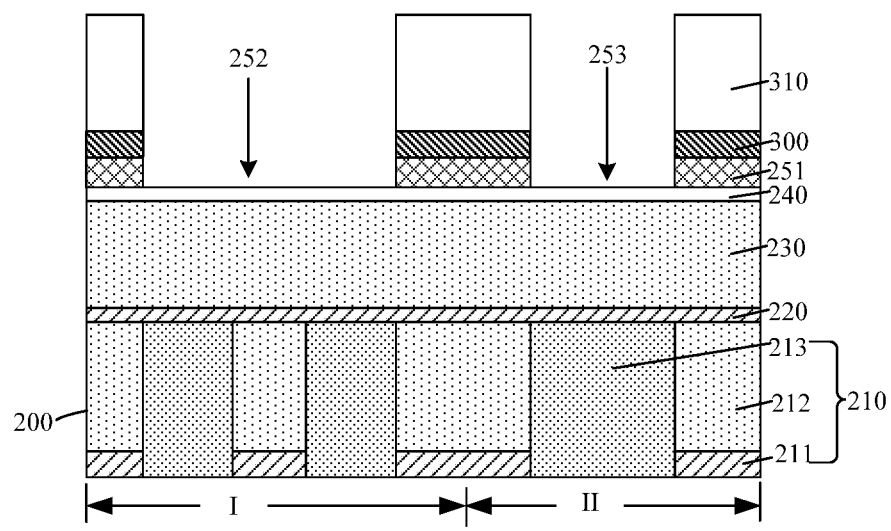

Returning to FIG. 17, after providing the base substrate, a medium layer with certain structures may be formed (S102). FIGS. 7-8 illustrate corresponding semiconductor structures.

Referring to FIGS. 7-8, a medium layer (not labeled) may be formed on the base substrate 200. The medium layer may provide a platform for subsequently forming an interconnection structure. In one embodiment, the medium layer may include a dielectric layer 230 formed on the base substrate 200, an oxide layer 240 formed on the dielectric layer 230, and a patterned hard mask layer 251 (shown in FIG. 8) formed on the oxide layer 240. A first mask opening 252 (shown in FIG. 8) may be formed in the hard mask layer 251 in the device region I, and a second mask opening 253 (shown in FIG. 8) may be formed in the hard mask layer 251 in the peripheral region II.

The dielectric layer 230 may be configured to electrically isolate the interconnection structures to be formed. In one embodiment, the dielectric layer 230 may be made of a material with porous structure. The material with porous structure may include low-K dielectric materials (dielectric constant is greater than or equal to 2.6 and is less than 3.9), or ultra-low-K dielectric materials (dielectric constant is less than 2.5), etc. Therefore, the parasitic capacitance between the interconnection structures to be formed may be effectively reduced, thereby reducing the RC delay of back end of line (BEOL) circuit.

The dielectric layer 230 may be made of SiOH, SiOCH, FSG (fluorine doped silicon dioxide), BSG (Boron doped silicon dioxide), PSG (phosphorus doped silicon dioxide), BPSG (boron and phosphorus doped silicon dioxide), HSQ (hydrosilsesquioxane, $(HSiO_{1.5})_n$), or MSQ (methyl silsesquioxane $(CH_3SiO_{1.5})_n$), etc. In one embodiment, the dielectric layer 230 may be made of low-K dielectric materials, such as SiOCH. A chemical vapor deposition process may be performed to form the dielectric layer 230.

The oxide layer 240 may be configured as an etching buffer layer for subsequent etching processes. Because the dielectric layer 230 is made of low-K dielectric materials, its characteristics is soft, thus an over-etching phenomenon may easily occur. The density and hardness of the oxide layer 240 may be desired, thus by forming the oxide layer 240 on the dielectric layer 230, the etched thickness of the dielectric layer 230 can be better controlled during a subsequent etching process. As a result, the morphology and size of the subsequently formed opening meet the process specifications. In one embodiment, the oxide layer 240 may be made of silicon oxide. A chemical vapor deposition process may be performed to form the oxide layer 240.

The hard mask layer 251 may be configured as an etching mask during subsequent etching processes. The etching process with the patterned hard mask layer 251 as an etching mask can better control the pattern morphology of the opening, and make the morphology of the formed opening smoother.

In one embodiment, the hard mask layer 251 may be a metal hard mask layer 251. The metal hard mask layer 251 may be made of titanium nitride. A physical vapor deposition process may be performed to form the metal hard mask layer 251. In certain embodiments, the metal hard mask layer 251 may be made of titanium, or copper nitride, etc.

In one embodiment, forming the medium layer may include: forming the dielectric layer 230 on the base interconnection structure 210; forming the oxide layer 240 on the dielectric layer 230; forming a hard mask film 250 on the oxide layer 240 (shown in FIG. 7); forming a first bottom anti-reflection layer 300 (shown in FIG. 7) on the hard mask film 250; and forming a first photoresist layer 310 (shown in FIG. 7) on the first bottom anti-reflection layer 300. The first photoresist layer 310 in the device region I may have a first pattern opening 311 (shown in FIG. 7). The first photoresist layer 310 in the peripheral region II may have a second pattern opening 312 (shown in FIG. 7). Forming the medium layer may also include sequentially etching the first bottom anti-reflection layer 300 and the metal hard mask film 250 through the first pattern opening 311 and the second pattern opening 312 with the first photoresist layer 310 as an etching mask to form the first mask opening 252 (shown in FIG. 8) exposing the oxide layer 240 in the hard mask film 250 in the device region I, and to form the second mask opening 253 (shown in FIG. 8) exposing the oxide layer 240 in the hard mask film 250 in the peripheral region II. The remaining hard mask film may be the patterned hard mask layer 251 (shown in FIG. 8). Further, forming the medium layer may include removing the first photoresist layer 310 and the first bottom anti-reflection layer 300.

The first bottom anti-reflection layer 300 may be configured to adsorb the light refracted into the first bottom anti-reflection layer 300, so as to improve the standing wave effect, thereby improving the pattern quality after exposure development.

The projection of the first mask opening 252 on the base substrate 200 may cover the projection of at least one base metal layer 213 in the device region I on the base substrate 200. The projection of the second mask opening 253 on the base substrate 200 may cover the projection of at least one base metal layer 213 in the peripheral region II on the base substrate 200.

In one embodiment, the projection of the first mask opening 252 on the base substrate 200 may cover the projection of two base metal layers 213 in the device region I on the base substrate 200. Thus, one subsequently formed interconnection structure may be in contact with two base metal layers 213 in the device region I. The projection of the second mask opening 253 on the base substrate 200 may cover the projection of one base metal layer 213 in the peripheral region II on the base substrate 200.

After providing the base substrate 200 and before forming the medium layer, an etching barrier layer 220 (shown in FIG. 7) may be formed on the base substrate 200. Correspondingly, the medium layer may be formed on the etching barrier layer 220 when forming the medium layer on the base substrate 200.

The top surface of the etching barrier layer 220 may be configured to define an etching stop position in a subsequent etching process. In one embodiment, the etching rate of the etching process for etching the dielectric layer 230 to the etching barrier layer 220 may be small, thus the etching barrier layer 220 may stop the etching process, so as to avoid over-etching of the etching process for etching the dielectric layer 230 to the base substrate 200 or the base metal layer 213.

After subsequently forming an initial through hole in the dielectric layer 230 in the device region I as well as an initial opening in the dielectric layer 230 in the peripheral region II, an over-etching process may be performed on the etching barrier layer 220 at the bottom of the initial through hole and the bottom of the initial opening to expose the base metal layer 213. Therefore, the etching rate of the over-etching process to the etching barrier layer 220 may be larger than the etching rate of the over-etching process to the base metal layer 213, so as to reduce the etching damages to the base metal layer 213. In one embodiment, the etching barrier layer 220 may be made of silicon carbonitride. A chemical vapor deposition process may be performed to form the etching barrier layer 220.

Figure 9:
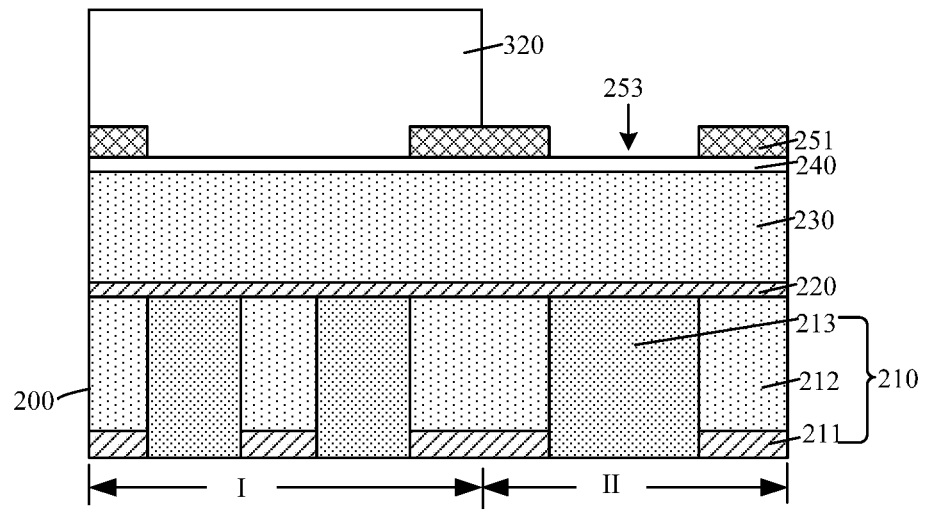
Figure 10:
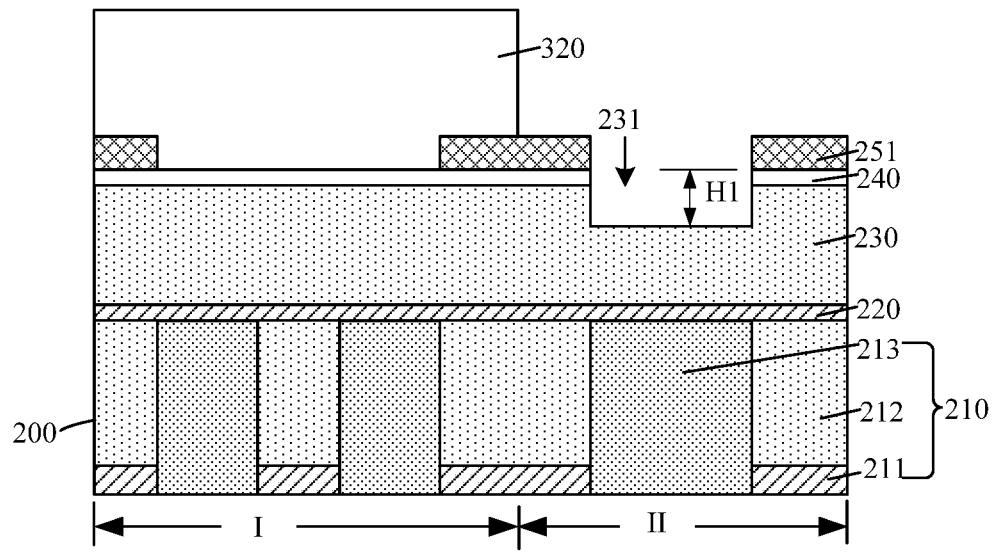

Returning to FIG. 17, after forming the medium layer, a first trench may be formed (S103). FIGS. 9-10 illustrate corresponding semiconductor structures.

Referring to FIGS. 9-10, a first trench 231 having a first depth 'H1' (shown in FIG. 10) may be formed in the medium layer (not labeled) in the peripheral region II. The first trench 231 may provide a platform for subsequently forming a second opening exposing the base metal layer 213 in the peripheral region II.

In one embodiment, forming the first trench 231 may include forming a first patterned layer 320 on the medium layer in the device region I. The first patterned layer 320 may cover the hard mask layer 251 and the oxide layer 240 in the device region I. Forming the first trench 231 may also include sequentially etching the oxide layer 240 and portions of thickness of the dielectric layer 230 through the second mask opening 253 with the first patterned layer 320 and the hard mask layer 251 as an etching mask to form the first trench 231 in the medium layer in the peripheral region II.

In one embodiment, the peripheral region II may surround the first region I. Correspondingly, after forming the first patterned layer 320, the second mask opening 253 may surround the first patterned layer 320.

In one embodiment, the first patterned layer 320 may be made of photoresist. A KrF photolithography process or an immersion photolithography process may be performed to form the first patterned layer 320.

In one embodiment, during the etching process of forming the first trench 231, the first patterned layer 320 may be in-situ removed. The in-situ removal means that after forming the first trench 231, the first patterned layer 320 may be also removed without the need for additional processing to remove the first patterned layer 320. In another embodiment, after forming the first trench 231, a wet etching or an ashing process may be additionally performed to remove the first patterned layer 320.

In one embodiment, the etching process of forming the first trench 231 may be a plasma dry etching process. In one embodiment, the parameters of the plasma dry etching process may include the following. The etching gas may include $CF_4$, and the diluent gas may include $N_2$, $O_2$, CO, He, or Ar, etc. The gas flow rate of the etching gas may be in a range of approximately 10 sccm-2000 sccm, and the gas flow rate of the diluent gas may be in a range of approximately 10 sccm-2000 sccm. The chamber pressure may be in a range of approximately 30 mTorr-1000 mTorr. In certain embodiments, the etching gas may include $CHF_3$, $CH_2F_2$, or $C_4F_8$ and other C—F based plasma etching gases.

The cross-sectional profile of the first trench 231 may be an inverted trapezoid, or the sidewall of the first trench 231 may be perpendicular to the surface of the base substrate 200. In one embodiment, the sidewall of the first trench 231 may be perpendicular to the surface of the base substrate 200.

Figure 11:
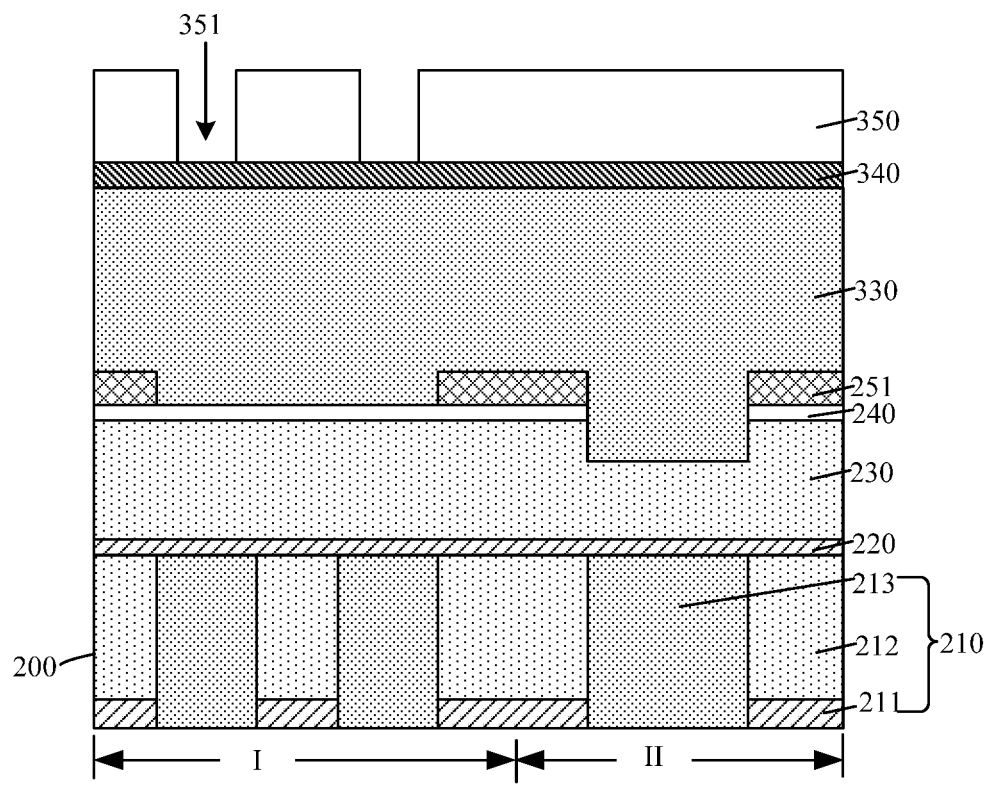
Figure 12:
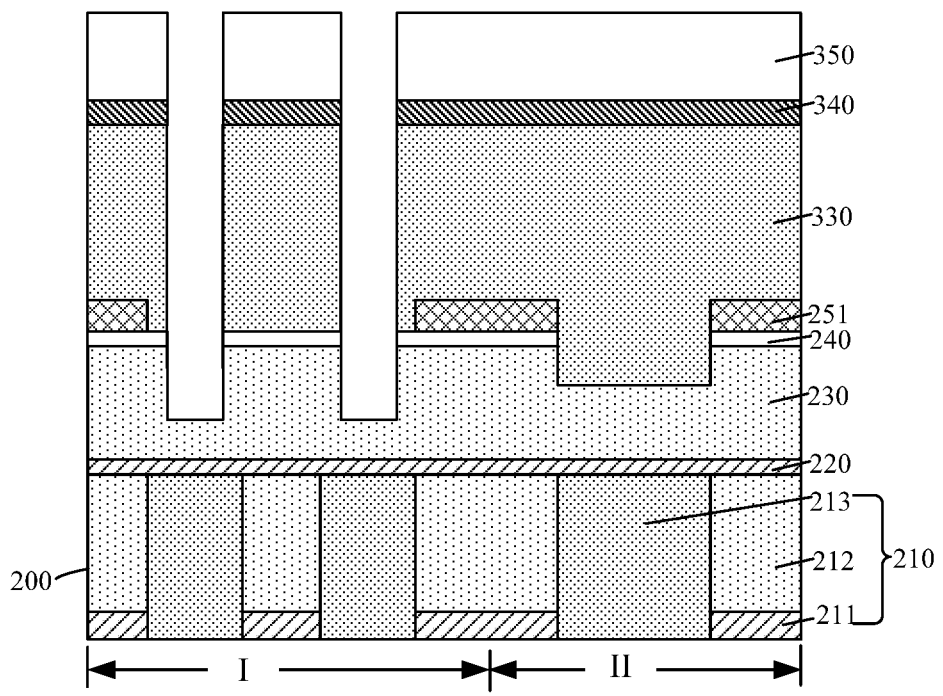
Figure 13:
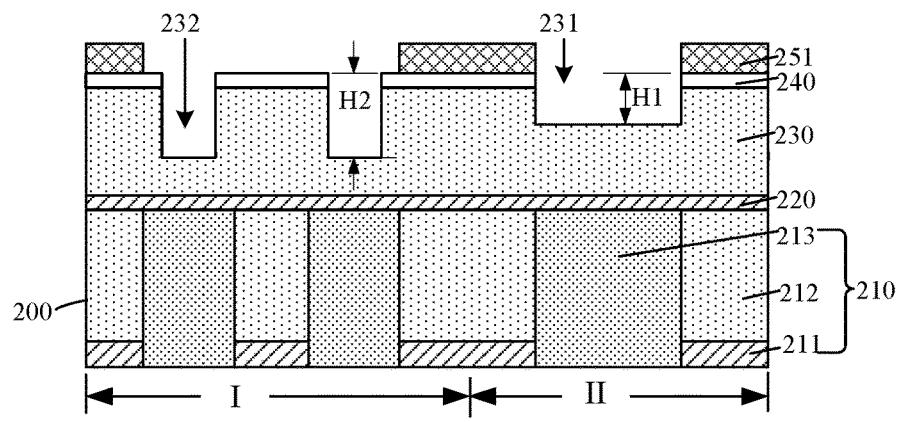

Returning to FIG. 17, after forming the first trench, a second trench may be formed (S104). FIGS. 11-13 illustrate corresponding semiconductor structures.

Referring to FIGS. 11-13, a second trench 232 having a second depth 'H2' (shown in FIG. 13) may be formed in the medium layer (not labeled) in the device region I. The second depth 'H2' may be larger than the first depth 'H1'. The second trench 232 may provide a platform for subsequently forming a through hole exposing the base metal layer 213 in the device region I.

In one embodiment, forming the second trench 232 may include forming a filling layer 330 completely filling the first mask opening 252 (shown in FIG. 8) and the first trench 231 (shown in FIG. 10). The filling layer may also cover the top of the hard mask layer 251. Forming the second trench 232 may also include forming a second bottom anti-reflection layer 340 on the filling layer 330, and forming a second patterned layer 350 on the second bottom anti-reflection layer 340. The second patterned layer 350 may include a second trench pattern opening 351 exposing portions of the second bottom anti-reflection layer 340 in the device region I (shown in FIG. 11). The projection of the second trench pattern opening 351 on the base substrate 200 may be located within the projection of the base metal layer 213 in the device region I on the base substrate 200. Further, forming the second trench 232 may include sequentially etching the second bottom anti-reflection layer 340, the filling layer 330, the oxide layer 240 and portions of thickness of the dielectric layer 230 through the second trench pattern opening 351 with the second patterned layer 350 as an etching mask to form the second trench 232 (shown in FIG. 13) in the medium layer in the device region I.

In one embodiment, the etching process of forming the second trench 232 may be a plasma dry etching process. In one embodiment, the parameters of the plasma dry etching process may include the following. The etching gas may include $CF_4$, and the diluent gas may include $N_2$, $O_2$, CO, He, or Ar, etc. The gas flow rate of the etching gas may be in a range of approximately 10 sccm-2000 sccm, and the gas flow rate of the diluent gas may be in a range of approximately 10 sccm-2000 sccm. The chamber pressure may be in a range of approximately 30 mTorr-1000 mTorr. In certain embodiments, the etching gas may include $CHF_3$, $CH_2F_2$, or $C_4F_8$ and other C—F based plasma etching gases.

The ratio of the first depth 'H1' to the second depth 'H2' cannot be too small nor too large. The first trench 231 and the second trench 232 may be subsequently etched at the same etching process. If the ratio is too small, when etching the dielectric layer 230 through the second trench 232 until the etching barrier layer 220 is exposed, the first trench 231 may not expose the etching barrier layer 220. When the first trench 231 exposes the etching barrier layer 220, the second trench 232 may easily expose the base metal layer 213, thereby causing even etching damages to the base metal layer 213. Conversely, the ratio cannot be too large. In one embodiment, the ratio of the first depth 'H1' to the second depth 'H2' may be in a range of approximately 0.2-0.8.

The filling layer 330 may be made of a material different from the medium layer. The material of the filling layer 330 may be easily removable, thus the subsequent process of removing the filling layer 330 cannot cause damages to the medium layer.

In one embodiment, the filling layer 330 may be an organic dielectric layer (ODL), and be formed by a spin-coating process. The top of the filling layer 330 may be above the top of the hard mask layer 251. In certain embodiments, the filling layer may be made of deep UV light absorbing oxide (DUO). The DUO material may be a siloxane polymer material, such as $CH_3$—SiOX, Si—OH, or $SiOH_3$, etc.

The second bottom anti-reflection layer 340 may be configured to absorb the light refracted into the second bottom anti-reflection layer 340, so as to improve the standing wave effect, thereby improving the pattern quality after exposure development. In one embodiment, the second patterned layer 350 may be made of photoresist.

The filling layer 330, the second bottom anti-reflection layer 340 and the second patterned layer 350 may form a three-layer composite patterned layer having a desired thickness and a pattern transfer quality. In one embodiment, the thickness of the filling layer 330 may be in a range of approximately 1800 Å-2200 Å, and the thickness of the second bottom anti-reflection layer 340 may be in a range of approximately 350 Å-450 Å.

After forming the second trench 232, the second patterned layer 350, the second bottom anti-reflection layer 340, and the filling layer 330 may be removed. A wet etching or an ashing process may be performed to remove the second patterned layer 350, the second bottom anti-reflection layer 340, and the filling layer 330.

The cross-sectional profile of the second trench 232 may be an inverted trapezoid, or the sidewall of the second trench 232 may be perpendicular to the surface of the base substrate 200. In one embodiment, the sidewall of the second trench 232 may be perpendicular to the surface of the base substrate 200.

In one embodiment, the first trench 231 may be first formed, and then the second trench 232 may be formed. In another embodiment, the second trench may be first formed, and then the first trench may be formed.

Correspondingly, forming the second trench may include forming a third patterned layer filling the first mask opening and the second mask opening and covering the top of the hard mask layer. The third patterned layer may include a second trench pattern opening exposing portions of oxide layer in the device region. The projection of the second mask pattern opening on the base substrate may be located within the projection of the base metal layer on the base substrate. Forming the second trench may also include sequentially etching the oxide layer and portions of thickness of the dielectric layer through the second trench pattern opening with the third patterned layer as an etching mask to form the second trench in the medium layer in the device region.

Correspondingly, forming the first trench may include forming a filling layer completely filling the first mask opening and the second trench. The filling layer may also cover the top of the hard mask layer in the device region. Forming the first trench may also include forming a bottom anti-reflection layer on the filling layer, and forming a fourth patterned layer on the bottom anti-reflection layer. Further, forming the first trench may include sequentially etching the bottom anti-reflection layer, the filling layer, the oxide layer and portions of thickness of the dielectric layer through the second mask opening with the fourth patterned layer and the hard mask layer as an etching mask to form the first trench in the medium layer in the peripheral region.

Figure 14:
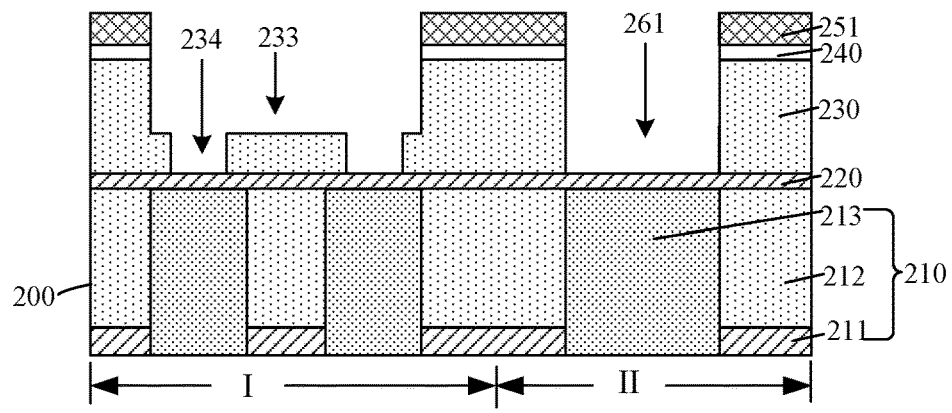

Returning to FIG. 17, after forming the second trench, a first opening and a second opening may be formed (S105). FIGS. 14-15 illustrate corresponding semiconductor structures.

Referring to FIGS. 14-15, by etching the medium layer at the bottom and sidewall of the second trench 232 (shown in FIG. 13) as well as the medium layer at the bottom of the first trench 231 (shown in FIG. 13), a first opening 262 exposing the base interconnection structure 210 may be formed in the medium layer in the device region I, and a second opening 263 exposing the base interconnection structure 210 may be formed in the medium layer in the peripheral region II. The first opening 262 may provide a space position for subsequently forming a first interconnection structure. The second opening 263 may provide a space position for subsequently forming a second interconnection structure.

In one embodiment, the first opening 262 may include a trench 233 and a through hole 236 penetrating through each other. The bottom of the trench 233 may be connected to the top of the through hole 236, and the bottom opening size of the trench 233 may be larger than the top opening size of the through hole 236.

In one embodiment, forming the first opening 262 and the second opening 263 may include performing a main etching process on the medium layer at the bottom and sidewall of the second trench 232 as well as the medium layer at the bottom of the first trench 231 until the etching barrier layer 220 is exposed, to form the trench 233 and an initial through hole 234 (shown in FIG. 14) penetrating through each other in the medium layer in the device region I, and to form an initial opening 261 (shown in FIG. 14) in the medium layer in the peripheral region II. The bottom of the trench 233 may be connected to the top of the initial through hole 234, and the bottom opening size of the trench 233 may be larger than the top opening size of the initial through hole 234. Forming the first opening 262 and the second opening 263 may also include performing an over-etching process on the etching barrier layer 220 at the bottom of the initial through hole 234 and on the etching barrier layer 220 at the bottom of the initial opening 261, to form the through hole 236 (shown in FIG. 14) exposing the base interconnection structure 210 in the medium layer in the device region I, and to form the second opening 263 exposing the base interconnection structure 210 in the medium layer in the peripheral region II. The bottom of the trench 233 and the top of the through hole 236 may be connected to form the first opening 262, and the bottom opening size of the trench 233 may be larger than the top opening size of the through hole 236.

In one embodiment, the trench 233 and at least one through hole 236 may be penetrated through each other. In one embodiment, the projection of the first mask opening 252 (shown in FIG. 8) on the base substrate 200 may cover the projection of two base metal layers 213 in the device region I on the base substrate 200. Therefore, the trench 233 and two adjacent through holes 236 may be penetrated through each other. In other words, the first opening may expose the two adjacent base metal layers 213.

In one embodiment, the sidewalls of the trench 233, the through hole 236, and the second opening 263 may be perpendicular to the surface of the base substrate 200. In certain embodiments, the cross-sectional profiles of the trench, the through hole, and the second opening may be inverted trapezoids.

In one embodiment, both the main etching process and the over-etching process may be a plasma dry etching process. In one embodiment, the parameters of the main etching process may include the following. The etching gas may include $CF_4$, and the diluent gas may include $N_2$, $O_2$, CO, He, or Ar, etc. The gas flow rate of the etching gas may be in a range of approximately 10 sccm-200 sccm, and the gas flow rate of the diluent gas may be in a range of approximately 10 sccm-200 sccm. The chamber pressure may be in a range of approximately 30 mTorr-200 mTorr. In certain embodiments, the etching gas may include $CHF_3$, $CH_2F_2$, or $C_4F_8$ and other C—F based plasma etching gases.

In one embodiment, the parameters of the over-etching process may include the following. The etching gas may include $CF_4$, and the diluent gas may include $N_2$, $O_2$, CO, He, or Ar, etc. The gas flow rate of the etching gas may be in a range of approximately 10 sccm-2000 sccm, and the gas flow rate of the diluent gas may be in a range of approximately 10 sccm-2000 sccm. The chamber pressure may be in a range of approximately 30 mTorr-1000 mTorr. In certain embodiments, the etching gas may include $CHF_3$, $CH_2F_2$, or $C_4F_8$ and other C—F based plasma etching gases.

After forming the first opening 262 and the second opening 263, a hydroxy dopamine organic solvent (EKC) and a diluted hydrofluoric acid (DHF) may be used to wet clean the first opening 262 and the second opening 263. Thus, the surface cleanliness of the first opening 262 and the second opening 263 may be improved, thereby improving the formation quality of the subsequently formed first interconnection structure and second interconnection structure. In one embodiment, the EKC solution may be first used for cleaning. In another embodiment, the DHF solution may be first used for cleaning.

The EKC solution is a non-fluorine containing alkaline solution, and may be configured to reduce the corrosive effect of the fluorine element in the DHF solution on the interface at which the oxide layer 240 and the dielectric layer 230 are bonded. In one embodiment, the wet cleaning time of the EKC solution may be in a range of approximately 1 minute-20 minutes; the volume ratio of the deionized water to the hydrofluoric acid (HF) of the DHF solution may be in a range of approximately 100:1-1000:1; and the wet cleaning time of the DHF solution may be in a range of approximately 1 minute-20 minutes.

Returning to FIG. 17, after forming the first opening and the second opening, a first interconnection structure and a second interconnection structure may be formed (S106). FIG. 16 illustrates a corresponding semiconductor structure.

Referring to FIG. 16, a first interconnection structure 410I may be formed by filling the first opening 262 (shown in FIG. 15) with a conductive material, and a second interconnection structure 410II may be formed by filling the second opening 263 (shown in FIG. 15) with the conductive material. The first interconnection structure 410I and the second interconnection structure 410II may be configured to connect to the upper interconnection structure, and also be configured to connect to the external device or other metal layers, etc.

In one embodiment, forming the first interconnection structure 410I and the second interconnection structure 410II may include filling the first opening 262 and the second opening 263 with the conductive material. The conductive material may also cover the top of the hard mask layer 251 (shown in FIG. 15). Forming the first interconnection structure 410I and the second interconnection structure 410II may also include removing the conductive material, the hard mask layer 251 and the oxide layer 240 (shown in FIG. 15) above the top of the dielectric layer 230 to form the first interconnection structure 410I and the second interconnection structure 410II.

In one embodiment, a first interconnection-containing structure 271 in the device region I may include the etching barrier layer 220 formed on the base interconnection structure 210 in the device region I, the dielectric layer 230 formed on the etching barrier layer 220, and the first interconnection structure 410I in the dielectric layer 230. A second interconnection-containing structure 272 in the peripheral region II may include the etching barrier layer 220 formed on the base interconnection structure 210 in the peripheral region II, the dielectric layer 230 formed on the etching barrier layer 220, and the second interconnection structure 410II in the dielectric layer 230.

In one embodiment, the first interconnection structure 410I and the second interconnection structure 410II may be made of Cu, and the process of forming the first interconnection structure 410I and the second interconnection structure 410II may be an electroplating process. In certain embodiments, the first interconnection structure 410I and the second interconnection structure 410II may also be made of Al, or W and other conductive materials.

After forming the first opening 262 and the second opening 263 and before filling the first opening 262 and the second opening 263 with the conductive material, a barrier layer (not labeled) may be formed on the bottom and sidewalls of the first opening 262 and the second opening 263. The barrier layer may also cover the surface of the hard mask layer 251. An adhesive layer (not labeled) may be formed on the barrier layer.

The barrier layer may be configured to prevent the conductive material 410 from penetrating into the dielectric layer 230 when filling the conductive material into the first opening 262 and the second opening 263, so as to avoid the influence on the performance of the back end of line (BEOL) circuit. In one embodiment, the barrier layer may be made of TaN. In another embodiment, the barrier layer may be made of Ru.

The adhesive layer may be configured to increase the adhesion of the conductive material when filling the conductive material into the first opening 262 and the second opening 263, so as to improve the filling capability of the conductive material, thereby improving the formation quality of the first interconnection structure 410I and the second interconnection structure 410II. In one embodiment, the adhesive layer may be made of Ta.

After forming the adhesive layer and before filling the first opening 262 and the second opening 263 with the conductive material, a metal energy barrier layer and a copper seed layer (not labeled) may be deposited on the adhesive layer by a sputtering process to improve the coverage capability of the conductive material during the electroplating process.

Accordingly, when forming the first opening 262 (shown in FIG. 15) in the device region I and forming the second opening 263 (shown in FIG. 15) in the peripheral region II, a first trench 231 (shown in FIG. 13) may be formed in the medium layer in the peripheral region II, a second trench 232 (shown in FIG. 13) may be formed in the medium layer in the device region I, and the depth 'H1' of the first trench 231 may be smaller than the depth 'H2' of the second trench 232 (shown in FIG. 13). Therefore, when etching the dielectric layer 230 through the first trench 231 and the second trench 232, the issue of first forming the second opening 263 exposing the base interconnection structure 210 in the peripheral region II can be avoided. As a result, when forming the first opening 262, the issue of etching the base interconnection structure 210 through the second opening 263 can be avoided, so as to avoid etching damages to the base interconnection structure 210 in the peripheral region II, thereby improving the electrical performance of the formed semiconductor device.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a base substrate including a device region and a peripheral region surrounding the device region, wherein the base substrate includes a base interconnection structure formed in each of the device region and the peripheral region;
   forming a medium layer on the base substrate;
   forming a first trench having a first depth in the medium layer in the peripheral region;
   forming a second trench having a second depth in the medium layer in the device region, wherein the second depth is greater than the first depth;
   forming a first opening exposing the base interconnection structure in the medium layer in the device region and forming a second opening exposing the base interconnection structure in the medium layer in the peripheral region by etching the medium layer at a bottom and a sidewall of the second trench and etching the medium layer at a bottom of the first trench; and
   forming a first interconnection structure by filling the first opening with a conductive material and forming a second interconnection structure by filling the second opening with the conductive material.

2. The method according to claim 1, wherein:
   a ratio of the first depth to the second depth is in a range of approximately 0.2-0.8.

3. The method according to claim 1, wherein:
when forming the first opening exposing the base interconnection structure in the medium layer in the device region,
the first opening includes a trench extended from the second trench and a through hole under the trench, penetrating through each other; and
a bottom opening size of the trench is larger than a top opening size of the through hole.

4. The method according to claim 3, after providing the base substrate and before forming the medium layer on the base substrate, further including:
forming an etching barrier layer on the base substrate; and
forming the medium layer on the etching barrier layer when forming the medium layer on the base substrate.

5. The method according to claim 4, wherein forming the first opening and the second opening includes:
performing a main etching process on the medium layer at the bottom and the sidewall of the second trench as well as on the medium layer at the bottom of the first trench until the etching barrier layer is exposed;
forming the trench and an initial through hole penetrating through each other in the medium layer in the device region, wherein the bottom of the trench is connected to a top of the initial through hole, and the bottom opening size of the trench is larger than a top opening size of the initial through hole;
forming an initial opening in the medium layer in the peripheral region;
performing an over-etching process on the etching barrier layer at a bottom of the initial through hole and on the etching barrier layer at a bottom of the initial opening;
forming the through hole exposing the base interconnection structure in the medium layer in the device region, wherein the bottom of the trench and the top of the through hole are connected to form the first opening, and the bottom opening size of the trench is larger than the top opening size of the through hole; and
forming the second opening exposing the base interconnection structure in the medium layer in the peripheral region.

6. The method according to claim 5, wherein:
each of the main etching process and the over-etching process includes a plasma dry etching process.

7. The method according to claim 1, wherein forming the medium layer on the base substrate includes:
forming a dielectric layer on the base substrate;
forming an oxide layer on the dielectric layer; and
forming a patterned hard mask layer on the oxide layer, wherein the hard mask layer in the device region includes a first mask opening, and the hard mask layer in the peripheral region includes a second mask opening.

8. The method according to claim 7, wherein:
when etching the medium layer at the bottom and the sidewall of the second trench as well as the medium layer at the bottom of the first trench,
the etching process is performed with the patterned hard mask layer as an etching mask.

9. The method according to claim 8, wherein forming the first trench includes:
forming a first patterned layer on the medium layer in the device region, wherein the first patterned layer covers the hard mask layer and the oxide layer in the device region; and
sequentially etching the oxide layer and portions of thickness of the dielectric layer through the second mask opening with the first patterned layer and the hard mask layer as an etching mask to form the first trench in the medium layer in the peripheral region.

10. The method according to claim 9, wherein:
the second mask opening surrounds the first patterned layer after forming the first patterned layer.

11. The method according to claim 9, wherein:
the first patterned layer is made of photoresist; and
the first patterned layer is formed by performing a KrF photolithography process or an immersion photolithography process.

12. The method according to claim 9, wherein:
the first patterned layer is in-situ removed during the etching process of forming the first trench.

13. The method according to claim 9, wherein:
the etching process of forming the first trench is a plasma dry etching process.

14. The method according to claim 9, wherein forming the second trench includes:
forming a filling layer completely filling the first mask opening and the first trench, wherein the filling layer covers a top of the hard mask layer;
forming a second bottom anti-reflection layer on the filling layer;
forming a second patterned layer on the second bottom anti-reflection layer, wherein the second patterned layer includes a second trench pattern opening exposing portions of the second bottom anti-reflection layer in the device region, and a projection of the second trench pattern opening on the base substrate is located within a projection of the base metal layer on the base substrate; and
sequentially etching the second bottom anti-reflection layer, the filling layer, the oxide layer and portions of thickness of the dielectric layer through the second trench pattern opening with the second patterned layer as an etching mask to form the second trench in the medium layer in the device region.

15. The method according to claim 8, wherein forming the second trench includes:
forming a third patterned layer filling the first mask opening and the second mask opening and covering a top of the hard mask layer, wherein the third patterned layer includes a second trench pattern opening exposing portions of the oxide layer in the device region, and a projection of the second mask pattern opening on the base substrate is located within a projection of the base metal layer on the base substrate; and
sequentially etching the oxide layer and portions of thickness of the dielectric layer through the second trench pattern opening with the third patterned layer as an etching mask to form the second trench in the medium layer in the device region.

16. The method according to claim 15, wherein forming the first trench includes:
forming a filling layer completely filling the first mask opening and the second trench, wherein the filling layer covers the top of the hard mask layer in the device region;
forming a bottom anti-reflection layer on the filling layer;
forming a fourth patterned layer on the bottom anti-reflection layer; and
sequentially etching the bottom anti-reflection layer, the filling layer, the oxide layer and portions of thickness of the dielectric layer through the second mask opening with the fourth patterned layer and the hard mask layer as an etching mask to form the first trench in the medium layer in the peripheral region.

17. The method according to claim 1, after forming the first opening and the second opening, and before filling the first opening and the second opening with the conductive material, further including:

forming a seed layer at bottom and sidewalls of the first opening and the second opening.

\* \* \* \* \*